United States Patent [19]
Hegeler

[11] Patent Number: 6,032,030
[45] Date of Patent: Feb. 29, 2000

[54] PROCESS FOR STORING OF DATA OF A RECEIVED CARRIER FREQUENCY OF A BROADCAST TRANSMITTER

[75] Inventor: Wilhelm Hegeler, Hildesheim, Germany

[73] Assignee: Robert Bosch GmbH, Stuttgart, Germany

[21] Appl. No.: 09/029,176

[22] PCT Filed: Jun. 19, 1997

[86] PCT No.: PCT/DE97/01263

§ 371 Date: May 11, 1998

§ 102(e) Date: May 11, 1998

[87] PCT Pub. No.: WO98/00915

PCT Pub. Date: Jan. 8, 1998

[30] Foreign Application Priority Data

Jun. 29, 1996 [DE] Germany .......................... 196 26 253

[51] Int. Cl.[7] .................................... H04B 1/18

[52] U.S. Cl. .................... 455/161.1; 455/185.1; 455/186.1

[58] Field of Search .............. 455/161.1, 161.2, 455/185.1, 186.1, 226.1, 226.2, 38.1

[56] References Cited

U.S. PATENT DOCUMENTS

| | | | |
|---|---|---|---|
| 5,537,674 | 7/1996 | Kishimoto et al. | 455/161.1 |
| 5,631,707 | 5/1997 | D'Errico | 455/186.1 |
| 5,640,696 | 6/1997 | Ishikawa et al. | 455/161.1 |
| 5,822,686 | 10/1998 | Lundberg et al. | 455/161.1 |
| 5,857,149 | 1/1999 | Suzuki | 455/186.1 |
| 5,946,605 | 8/1999 | Takahisa et al. | 455/161.1 |

FOREIGN PATENT DOCUMENTS

3917263 A1  12/1989  Germany .
39 17 236    8/1990   Germany .

Primary Examiner—Dwayne D. Bost
Assistant Examiner—Quochien Ba Vuong
Attorney, Agent, or Firm—Kenyon & Kenyon

[57] ABSTRACT

A method for storing the data of a received carrier frequency of a radio transmitter, and/or of the evaluation of its reception, in a data memory of a radio receiver. In the method, the regional identifier is detached from the particular PI code received with the carrier frequency; and the remaining main portion of the PI code, the detached regional identifier, and lastly the received carrier frequency are respectively written into empty locations, existing or to be created, between the stored data, arranged in ascending order, of other carrier frequencies, if the data are not already stored.

3 Claims, 1 Drawing Sheet

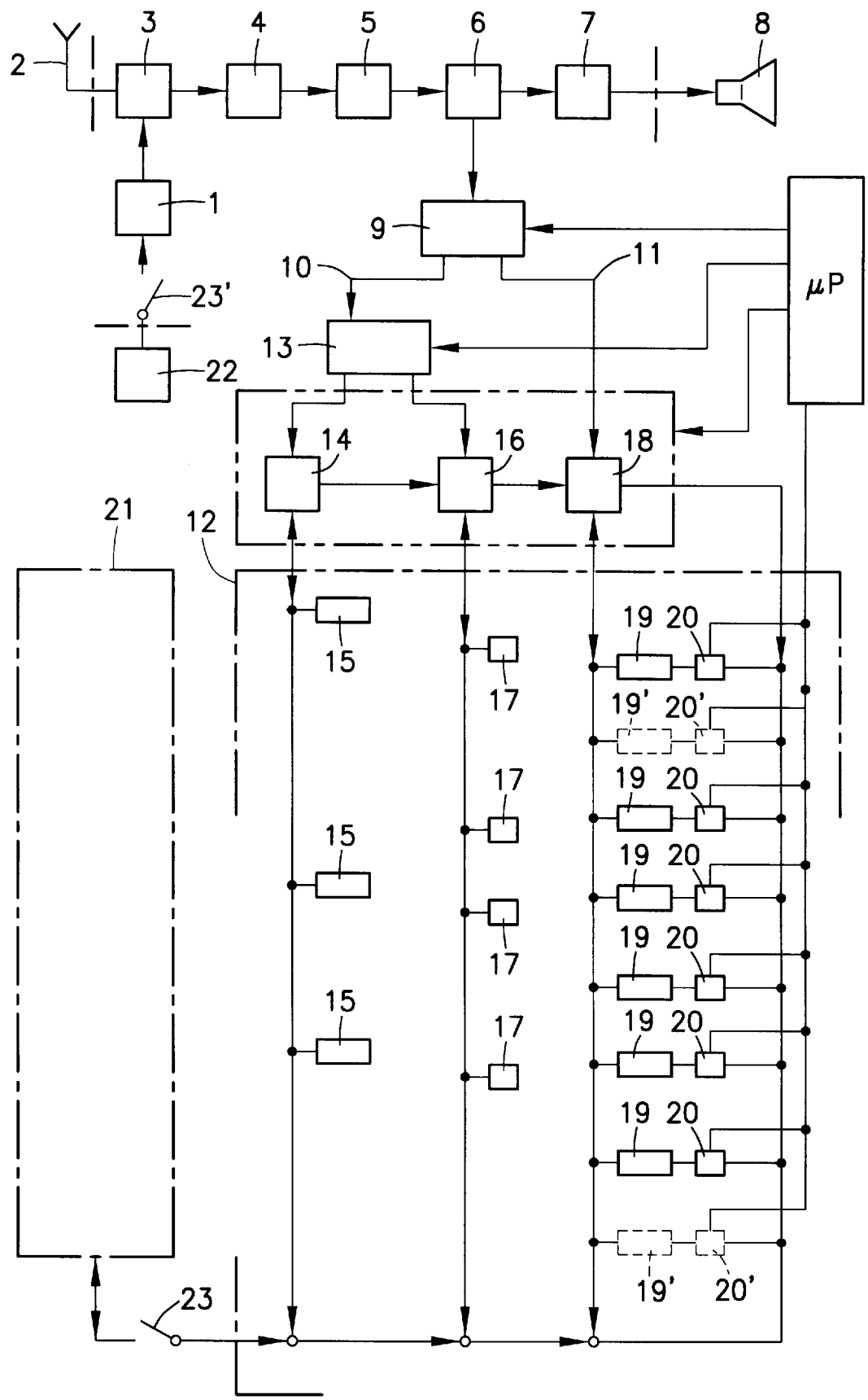

PROCESS FOR STORING OF DATA OF A RECEIVED CARRIER FREQUENCY OF A BROADCAST TRANSMITTER

FIELD OF THE INVENTION

The present invention relates to a method for storing the data of a received carrier frequency of a radio transmitter.

BACKGROUND INFORMATION

There are on the market radio receivers having a data memory in which the transmitters being received are stored, with their PI codes and their alternative frequencies, in the sequence of their reception.

Also known, from German Pat. No. DE 39 17 263 A1, are data memories in which there is associated with each memory cell for an alternative frequency an evaluation memory which registers how often it is received.

In the known radio receivers, when a change occurs in the program being received, a check is first made as to whether the PI code associated with the program just selected, and the carrier frequency being received, are already stored. When, for example, the result is only that the number in the evaluation memory is incremented because the carrier frequency is already stored.

BRIEF DESCRIPTION OF THE DRAWINGS

FIG. 1 depicts an exemplary block diagram of a radio receiver having a data memory configured for the method according to the present invention.

DETAILED DESCRIPTION

The radio receiver as shown in FIG. 1 is set, by means of an operating element 1, to a specific carrier frequency of a radio transmitter which lies in the frequency spectrum received via the attached antenna 2. In mixer stage 3, the selected carrier frequency is separated from the other carrier frequencies in the frequency spectrum being received. The modulation of the selected carrier frequency is converted to an intermediate frequency and amplified in IF stage 4, and then separated from the intermediate frequency in demodulator 5. The modulation then passes through a frequency splitter 6. The low-frequency program signal in the modulation is amplified in a LF stage 7, and made audible via a connected loudspeaker 8.

In a decoder 9 which is located downstream from a second output of frequency splitter 6, the 57-kHz auxiliary carrier for the RDS signals are demodulated in the modulation of a received RDS transmitter, and the recovered RDS signals are decoded.

The sequence of process steps in decoder 9 necessary for decoding and for storage of the received RDS signals in the circuit stages described below is controlled, in known fashion, by the program of a microprocessor μP (not depicted in further detail).

In FIG. 1, the functional stages described below are depicted, for the sake of clarity, as physically separated circuit stages. Their functions can, however, also be implemented by means of functional steps succeeding one another in time in a program-controlled circuit stage.

After decoding, the data of the recovered PI code of the received RDS transmitter can be tapped at an output 10 of decoder 9, and the data of the selected carrier frequency can be tapped at an output 11 of decoder 9. These data are compared with the data stored in a main memory 12, and stored again if applicable.

In FIG. 1, the memory cells for the data to be stored are depicted, for the sake of clarity, as being physically separated in terms of their various significances and pertinences, and those memory cells with the same significance are interconnected by means of a bus line. In practice, this association of the data with one another is achieved, in known fashion, by appropriate addressing of the data when they are stored.

In contrast to the existing art, the program of the microprocessor is additionally designed, when new data are being stored, so that first the regional identifier is detached from the full PI code in a regional stage 13 which is downstream from output 10 of decoder 9. When a PC code is received for the first time, this regional identifier is stored separately from the main portion of the PI code.

The remaining main portion of the received PI code is then compared, in a first comparison stage 14 or in a first comparison step, with the main portions, arranged in ascending order and called up in succession from associated memory cells 15 of main memory 12, of previously received PI codes. As soon as the comparison yields a match, a second comparison stage 16 or a second comparison step is enabled, in which the detached regional identifier in the received PI code is compared with the regional identifiers, arranged in ascending order and stored in associated memory cells 17 behind the main portion of the PI code, of transmitters received earlier. If a match results here as well, a third comparison stage 18, located in output 11 of the demodulator, is then enabled; from this, as already mentioned, the data of the selected carrier frequency can be tapped.

In third comparison stage 18 or in a third comparison step, this frequency is compared with the successively called-up frequencies which are stored in memory cell 19 of one of the frequency blocks arranged after the detected region, and which had already been deposited there earlier, arranged in ascending order. In the event of a match, the output of third comparison stage 18 controls checking of the number which is stored in an evaluation memory 20 which is associated with memory cells 19 interrogated for the comparison.

The significance of this number depends on the program of microprocessor μP; it can, for example, contain an evaluation of the receivability of the carrier frequency on the last occasion it was received, e.g. the field strength. If this new field strength is greater than the stored value, this new value is then written into the evaluation memory.

If no matching frequency indication is located in memory cells 19, the carrier frequency just selected is written into an empty memory cell at the point appropriate for it based on its magnitude. The regional identifier and the main portion of the PI code of the carrier frequency just selected are also written into a memory cell at the point appropriate for them, if one of the two comparison steps mentioned earlier yields no match.

If no empty memory cell is located at the point appropriate for the data based on their magnitude, then either
  the data which are greater than the received data and which are located in front of the next empty memory cell or cells are shifted toward the end of the memory, so that one or more empty memory cells are created at the desired point; or
  the data which are less than the received data and are located behind the next empty memory cell are shifted toward the beginning of the memory, so that one or more empty memory cells are created at the desired point.

If however, main memory 12 has no empty memory cell available, the program of microprocessor μP then simultaneously decrements all the numbers written into evaluation memories 20 by one unit, or if applicable by several units, until at least one of evaluation memories 20 contains a zero, as a result of which the pertinent frequency is deleted and at least one empty memory cell 19' is created, into which the remaining data can be shifted in the manner mentioned.

If the frequency to be deleted is the only frequency in the frequency block associated with a regional identifier, then the regional identifier itself and if applicable even the main portion of the PI code, is also deleted along with said frequency.

The decrease in value of the contents of the evaluation memory can also be inserted at regular intervals, as a process step, into the program of microprocessor μP, so that a frequency which was previously received properly and is thereafter not selected again, is automatically deleted after a certain time, and an empty memory cell is thus generated.

Once all the necessary entries and deletions have been performed, the information stored in main memory 12 is transferred via a switch 23 into an identically configured nonvolatile memory 21. Only when this transfer is complete can power supply 22 be effectively disconnected from the radio receiver if necessary, by opening tracking switch 23'.

Preferably a RAM can be utilized for main memory 12, and preferably an EEPROM can be utilized for nonvolatile memory 21.

What is claimed is:

1. A method for at least one of storing data of a received carrier frequency of a radio transmitter in a data memory of a radio receiver and evaluating a reception of the received carrier frequency, comprising the steps of:

detaching a regional identifier from a full transmitter identifier code, wherein the full transmitter identifier code is demodulated from the received carrier frequency;

performing a first comparison of a remaining portion of the full transmitter identifier code with previously stored transmitter identifier codes, wherein the previously stored transmitter identifier codes are arranged in ascending order in the data memory;

inserting the remaining portion of the full transmitter identifier code in a first empty memory cell location in the data memory when the remaining portion of the full transmitter identifier code does not match the previously stored transmitter identifier codes in the first comparison, wherein the first empty memory cell location corresponds to the remaining portion of the full transmitter identifier code arranged in ascending order with the previously stored transmitter identifier codes, wherein if the location is occupied an empty memory cell is created by displacing a previously stored transmitter identifier code occupying the location and all of the previously stored transmitter identifier codes higher or lower than the occupying previously stored transmitter identifier code into available memory cells;

performing a second comparison of the regional identifier with previously stored regional identifiers when the remaining portion of the full transmitter identifier code matches the previously stored transmitter identifier codes in the first comparison, wherein the previously stored regional identifiers are arranged in ascending order in a data block associated with the previously stored transmitter identifier codes matching the remaining portion of the fill transmitter identifier code;

inserting the regional identifier in a second empty memory cell location in the data block associated with the previously stored transmitter identifier codes matching the remaining portion of the full transmitter identifier code in the first comparison when the regional identifier does not match the previously stored regional identifiers in the second comparison, wherein the second empty memory cell location corresponds to the regional identifier arranged in ascending order with the previously stored regional identifiers, wherein if the location is occupied an empty memory cell is created by displacing a previously stored regional identifier occupying the location and all of the previously stored regional identifiers higher or lower than the occupying previously stored regional identifier into available memory cells;

performing a third comparison of the received carrier frequency with previously stored carrier frequencies when the regional identifier matches the previously stored regional identifiers in the second comparison, wherein the previously stored carrier frequencies are arranged in ascending order in a frequency block associated with the previously stored regional identifiers matching the regional identifier;

inserting the received carrier frequency in a third empty memory cell location in the frequency block associated with the previously stored regional identifiers matching the regional identifier in the first comparison when the received carrier frequency does not match the previously stored carrier frequencies in the third comparison, wherein the third empty memory cell location corresponds to the received carrier frequency arranged in ascending order with the previously stored carrier frequencies, wherein if the location is occupied an empty memory cell is created by displacing a previously stored carrier frequency occupying the location and all of the previously stored carrier frequencies higher or lower than the occupying previously stored carrier frequency into available memory cells;

evaluating a value stored in one of a plurality of evaluation memories when the received carrier frequency matches the previously stored carrier frequencies in the third comparison and replacing the value stored in the evaluation memory with a new value of the received carrier frequency when the new value is greater than the value stored in the evaluation memory, wherein the one of the evaluation memories is associated with the previously stored carrier frequencies matching the received carrier frequency; and in the absence of an empty memory cell, creating the empty memory cell by simultaneously decreasing values in the evaluation memories.

2. The method according to claim 1, wherein the values in the evaluation memories are simultaneously decreased at regular intervals creating interim empty memory cells.

3. The method according to claim 1, further comprising the step of reading the data memory into a nonvolatile memory before disconnecting a power supply.

* * * * *

UNITED STATES PATENT AND TRADEMARK OFFICE
CERTIFICATE OF CORRECTION

PATENT NO. : 6,032,030
DATED : February 29, 2000
INVENTOR(S) : Wilhelm Hegeler

It is certified that error appears in the above-identified patent and that said Letters Patent is hereby corrected as shown below:

Col. 1, line 23, delete "When" and insert --when--

Col. 1, line 23, insert --SUMMARY OF THE INVENTION
   The method according to the present invention reduces the time requirement of a search for a carrier frequency in the data memory. This is important--

Col. 2, line 57, delete "either" and insert --either:--

Col. 4, line 3, delete "fill" and insert --full--

Signed and Sealed this

Fifteenth Day of May, 2001

Attest:

NICHOLAS P. GODICI

Attesting Officer     Acting Director of the United States Patent and Trademark Office